United States Patent
Hartmann et al.

(10) Patent No.: US 6,516,256 B1
(45) Date of Patent: Feb. 4, 2003

(54) APPARATUS FOR STORING DATA IN A MOTOR VEHICLE

(75) Inventors: Stefan Hartmann, Hahnheim (DE); Dieter Gnatzy, Hochheim (DE); Stefan Hohrein, Mainz (DE)

(73) Assignee: Mannesmann VDO AG, Frankfurt (DE)

( * ) Notice: Subject to any disclaimer, the term of this patent is extended or adjusted under 35 U.S.C. 154(b) by 0 days.

(21) Appl. No.: 09/416,792

(22) Filed: Oct. 13, 1999

(30) Foreign Application Priority Data

Oct. 19, 1998 (DE) .......................... 198 48 090

(51) Int. Cl.[7] .............. G06F 19/00; G06F 7/22
(52) U.S. Cl. ................ 701/35; 701/33; 701/36; 701/24; 342/70; 342/109; 365/185.08; 365/185.07; 365/185.06; 340/870.02; 340/870.03; 340/459; 340/721; 340/722; 340/901; 340/903
(58) Field of Search .............. 701/35, 36, 33, 701/24; 342/70, 109; 365/185.08, 185.07, 185.06, 185.09; 340/870.02, 870.03, 459, 721, 722, 901, 903, 905, 907, 908, 942

(56) References Cited

U.S. PATENT DOCUMENTS

| | | | | |
|---|---|---|---|---|
| 4,814,896 A | * | 3/1989 | Heitzman et al. | 358/335 |
| 4,853,859 A | * | 8/1989 | Morita et al. | 364/424.04 |
| 4,916,621 A | * | 4/1990 | Bean et al. | 364/436 |
| 5,701,492 A | | 12/1997 | Wadsworth et al. | 395/712 |
| 5,850,254 A | * | 12/1998 | Takano et al. | 348/148 |
| 5,861,836 A | * | 1/1999 | Hoss | 342/70 |
| 5,874,904 A | * | 2/1999 | Hirabayashi et al. | 340/903 |
| 5,909,391 A | * | 6/1999 | Loibl | 365/185.08 |
| 5,929,785 A | * | 7/1999 | Satonaka | 340/903 |
| 6,052,632 A | * | 4/2000 | Lohoshi et al. | 701/36 |

FOREIGN PATENT DOCUMENTS

| | | |
|---|---|---|
| DE | 19625619 | 1/1998 |
| DE | 19638973 | 4/1998 |
| DE | 19639500 | 4/1998 |
| DE | 19740525 | 2/1999 |

* cited by examiner

Primary Examiner—William A. Cuchlinski, Jr.
Assistant Examiner—Ronnie Mancho
(74) Attorney, Agent, or Firm—Martin A. Farber

(57) ABSTRACT

An apparatus for storing data of a device, in particular of a motor vehicle, which is to be monitored, in which apparatus the data are preferably stored by means of a control unit in a memory unit.

In an apparatus which permits a plurality of data which change continuously during the service life of the motor vehicle to be stored in an operationally reliable way and with a high processing speed, the fixed data and the continuously updated data of the apparatus which is to be monitored are stored in the memory unit 15 which contains the open-loop and/or closed-loop control processes.

7 Claims, 4 Drawing Sheets

APPARATUS FOR STORING DATA IN A MOTOR VEHICLE

FIELD AND BACKGROUND OF THE INVENTION

The invention relates to an apparatus for storing data of a device which is to be monitored, in particular of a motor vehicle, in which apparatus the data are advantageously stored in a memory unit by means of a control unit.

DE 196 25 619 C2 discloses a method for storing data in a motor vehicle, in which adaptation data which are used to control the motor vehicle are firstly read into a first memory and, when the velocity of the motor vehicle drops below a predefined value, said data are read out of the memory again and stored in a second nonvolatile memory.

Such adaptation data are, in this context, control data which the control program requires to ensure the operation of the vehicle. During the service life of a control unit, the operational parameters of the device which is to be controlled by the control unit, in particular the motor vehicle, change. The control data therefore have to be continuously newly determined and the newly determined data have to be stored. In this way, it is possible to adapt the control programs to changes in the operational parameters of the device which is to be controlled.

Owing to the development of electronics in motor vehicles, an increasing amount of operational data has to be generated and adapted during the service life of the vehicle. Usually, a nonvolatile read-write memory is specially provided for storing the operation-dependent data. In order to execute a control process of the motor vehicle, the corresponding data are called from this read-write memory and processed by the central arithmetic unit. The NV-RAM's which are usually used as read-write memories are driven serially, which gives rise to long processing times.

SUMMARY OF THE INVENTION

The invention is thus based on the object of providing a device which makes it possible to store in an operationally reliable way and with a high processing speed a large amount of data which change continuously during the service life of the motor vehicle.

The object is achieved according to the invention in that the fixed data and the continuously updated data of the device which is to be monitored are stored in the memory unit which contains the open-loop and/or closed-loop processes.

The advantage of the invention consists in the fact that by using a memory containing open-loop and closed-loop programs to permanently store operation-dependent control data of the motor vehicle it is possible to dispense with one or more read-write memories. The fixed program code and the nonvolatile data are stored in a single electronic component, which results in a reduction in hardware. This reduction in hardware is a decisive advantage, in particular in view of the ever more complex electronic open-loop and closed-loop control systems which are being applied in motor vehicles, and because the installation space available in motor vehicles is becoming smaller and smaller, these things being an advantage because they permit a decisive reduction in costs.

In one refinement, the data which are to be updated are stored in an area of the memory unit which is permanently defined by the addresses of individual memory locations. This permanently addressed area makes available an easy-to-manage grouping of memory locations, which is utilised exclusively for cyclically storing driving-specific operational data and control data.

As an alternative to this, these data may be stored in an address space which is dependent on the physical organisation of the memory unit.

A different reading and clearing cycle can be implemented particularly easily when the defined area of the memory unit is divided into at least two sectors. When at least two sectors are used, it is ensured that each clearing procedure can be preceded by a writing procedure performed on the updated data.

Here, firstly the first sector of the defined area of the memory unit is completely filled with the operational data, and the first sector is not completely cleared until after data have been written to the first memory locations of the second sector. This ensures that the first sector of the defined area is not cleared until it has been ensured that the data stored in the second sector of the defined area are free of errors. In the event of errors, it is still possible to fall back on the data from the first sector in order to execute the open-loop and closed-loop processes.

The cycle rate of the possible storage operations increases in particular if data are alternately written to the two sectors of the defined area of the memory unit. This results in multiple use of the memory locations arranged in these sectors.

Writing data alternately to a plurality of sectors correspondingly increases the maximum permissible number of writing and clearing cycles of the memory unit.

The memory unit is advantageously an electrically clearable memory circuit. Commercially available flash modules can be used for this purpose.

In one refinement, the control unit is a device in the motor vehicle for controlling the distance between vehicles, which device stores, in a predefined time slot pattern, both object data and data relating to vehicle dynamics as operation-dependent data. Using the storage possibility according to the invention with such a device for controlling the distance between vehicles increases considerably the cycle time despite a large amount of data which are to be stored, comprising, for example, the distance and relative speed of the vehicles travelling in front, the coordinates of the driving corridor, and the velocity and acceleration of the motor vehicle which is to be controlled.

BRIEF DESCRIPTION OF THE DRAWINGS

The invention permits numerous embodiments. One of these will be explained in more detail with reference to the figures illustrated in the drawing, in which.

DETAILED DESCRIPTION OF THE PREFERRED EMBODIMENT

Identical features are identified using identical reference symbols.

Figure 1:
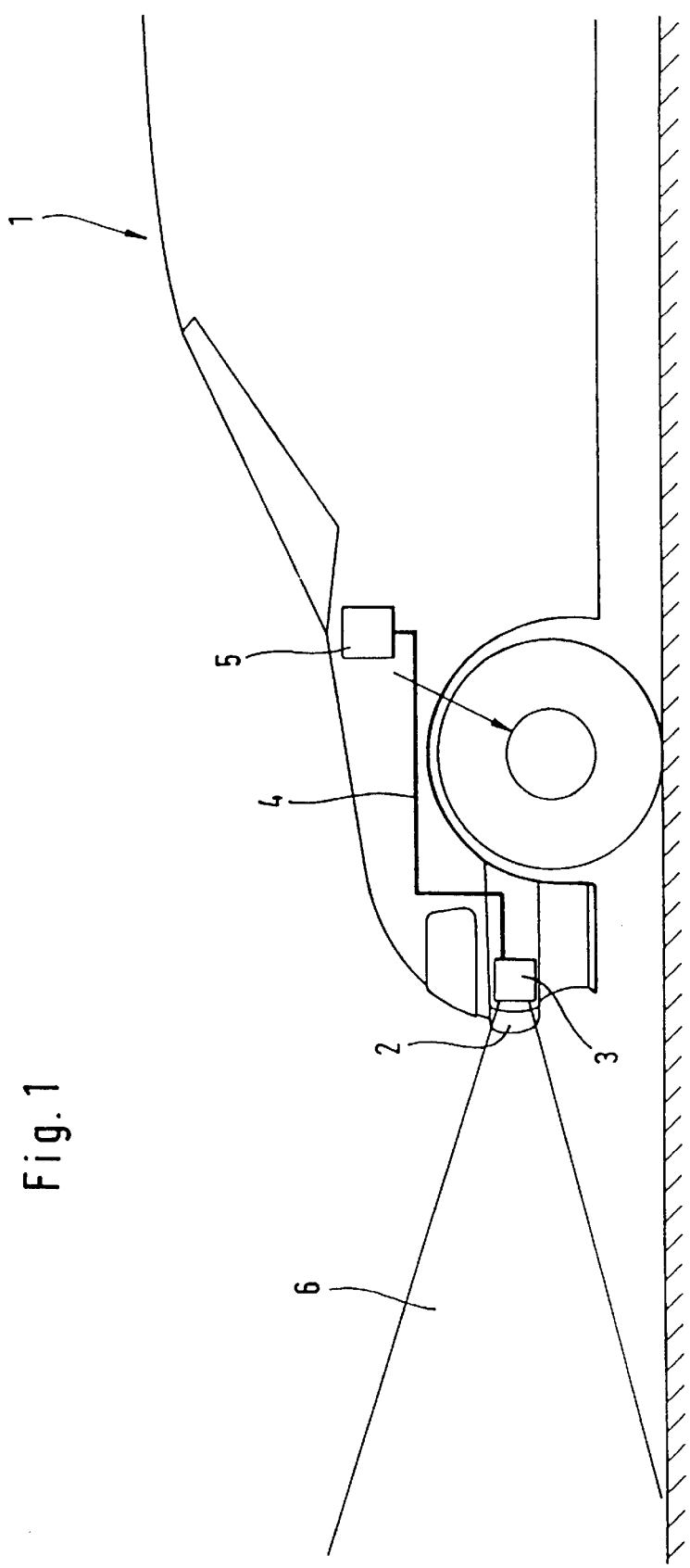
FIG. 1: shows a device in a motor vehicle for controlling the distance between vehicles.

In FIG. 1, an automatic system 3 for controlling velocity and the distance between vehicles in order to maintain a safe distance from vehicles is arranged on the sender 2 of a motor vehicle 1. The automatic system 3 for controlling velocity and the distance between vehicles is connected, for example, to the engine control system 5 via a bus system 4 which is present in the vehicle 1. Electronic commands automatically regulate the velocity and thus the distance of the vehicle 1, which is to be controlled, from a slower vehicle travelling in front. The vehicle travelling in front is sensed by the sensor beam 6 of a radar sensor 7 of the system 3 for controlling velocity and the distance between vehicles.

Figure 2:
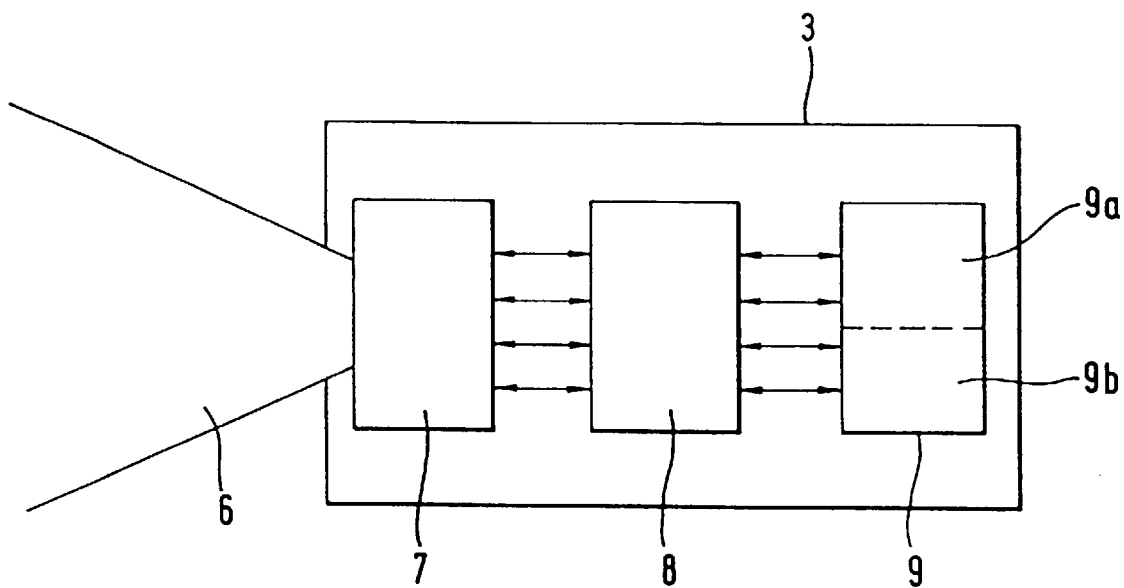
FIG. 2: shows the basic design of the device for controlling the distance between vehicles.

As is illustrated in FIG. 2, the automatic system for controlling velocity and the distance between vehicles forms one structural unit 3 between the sensor 7, the sensor signal conditioning arrangement 8 and the system 9 for controlling the distance between vehicles.

The system 9 for controlling the distance between vehicles has here a device 9a for determining a future course of travel of the motor vehicle and an object course of travel of the comparison object—as well as a longitudinal controller 9b which determines the actual distance from a control object, compares this distance with a predefined, stored reference distance and, if they do not correspond, brings about the reference distance from the control object by intervening in the engine control system 5.

The sensor 7 transmits signals at regular intervals, for example every 60 min, in the driving direction of the vehicle, which signals are reflected by the vehicles which are located in the sensor beam 6. The distance, the relative speed and the acceleration of the vehicle travelling in front are determined from these reflected signals by the signal conditioning circuit 8. These measurement results are passed on by the signal conditioning arrangement 8 to the system 9 for controlling the distance between vehicles. The signal conditioning circuit 8 simultaneously processes data from 30 obstacles travelling in front of the vehicle.

Figure 3:
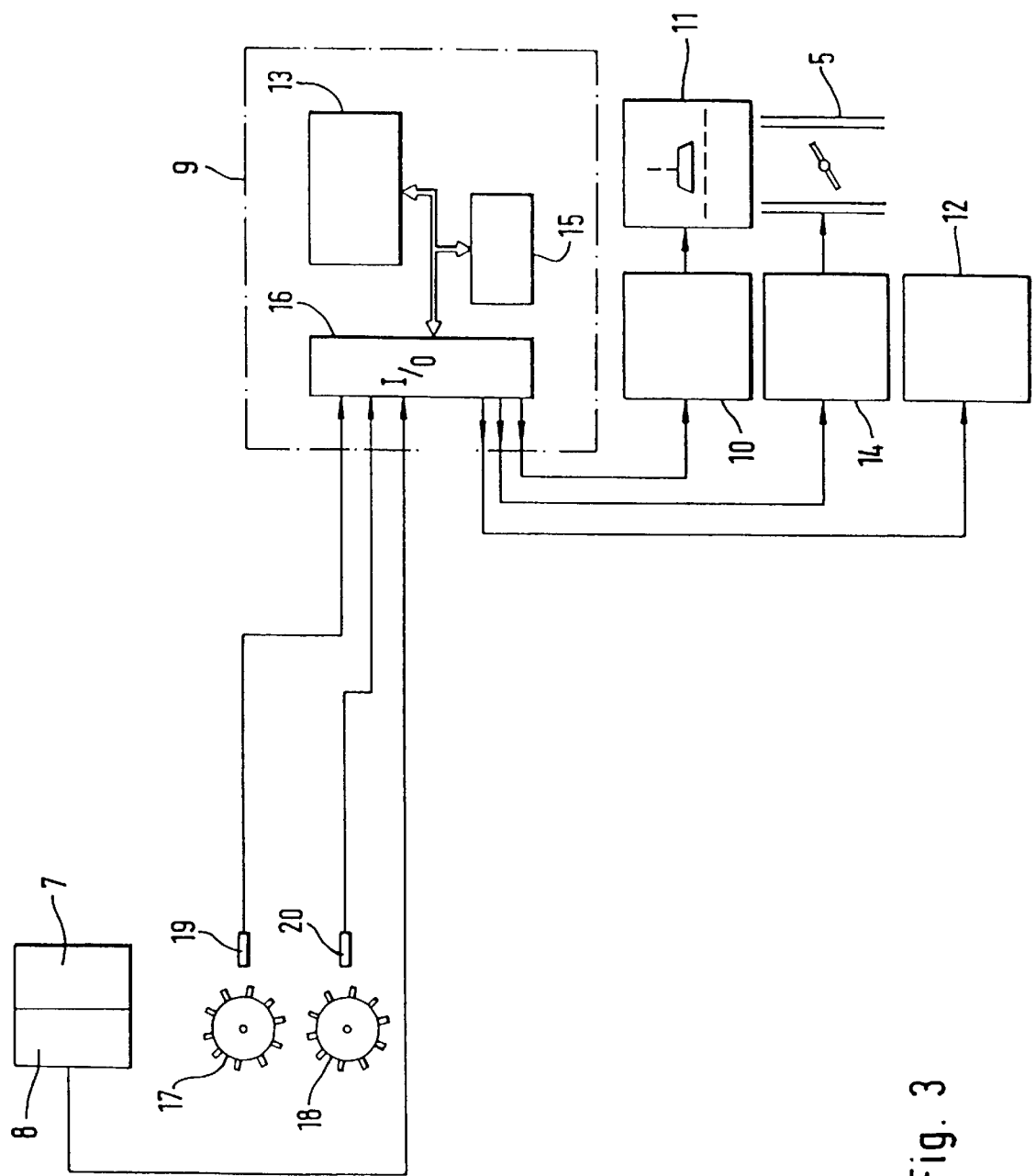
FIG. 3 shows an electrical arrangement of the device for controlling the distance between vehicles in the motor vehicle.

As is illustrated in FIG. 3, the system 9 for controlling the distance between vehicles is composed of a high-power microcomputer 13, a program memory 15 and an input/output unit 16. Here, the input/output unit 16 receives from the sensor conditioning circuit 8 the information which has been described above. The functions of determining the course of travel and the object course of travel as well as the longitudinal control are also performed by the microcomputer 9.

On the vehicle itself, the incremental discs 17 and 18 are arranged on each of the two front wheels (not illustrated in more detail). Rotational speed sensors 19, 20 are arranged opposite the incremental discs 17, 18. The rotational speed signals which are detected by the rotational speed sensors 19, 20 are also fed to the microcomputer 9 via the input/output unit 16. The microcomputer 9 calculates from them, inter alia, the vehicle velocity, the yaw rate and the curve radius which is currently being travelled along.

When a slower vehicle is approached, the microcomputer 9 automatically lowers the velocity of the vehicle and thus regulates the set reference distance from the vehicle travelling in front. In order to bring about automatic deceleration, it is possible to act on the engine control system 5, the brake 11 and/or to drive the transmission control system 12 in order to reduce the speed. The engine 5 and the brake 11 are driven here by means of one electrical output stage 10 and 14 each. If the course of travel is free again, the microcomputer 9 accelerates the vehicle 1 to the set desired speed. The system for controlling the distance between vehicles is always active when there is a vehicle travelling in front.

As already explained, in the application which has been presented, a plurality of data which change continuously and which also have to be appropriately stored are generated per time unit. Object data (distance, relative speed) and control-specific data (predicted driving corridor of the vehicle to be controlled, predicted object corridor of the control object) and measured values of the vehicle have to be stored per time unit. Such measured values of the vehicle are, for example, the velocity of the vehicle to be controlled and the acceleration.

Figure 4:
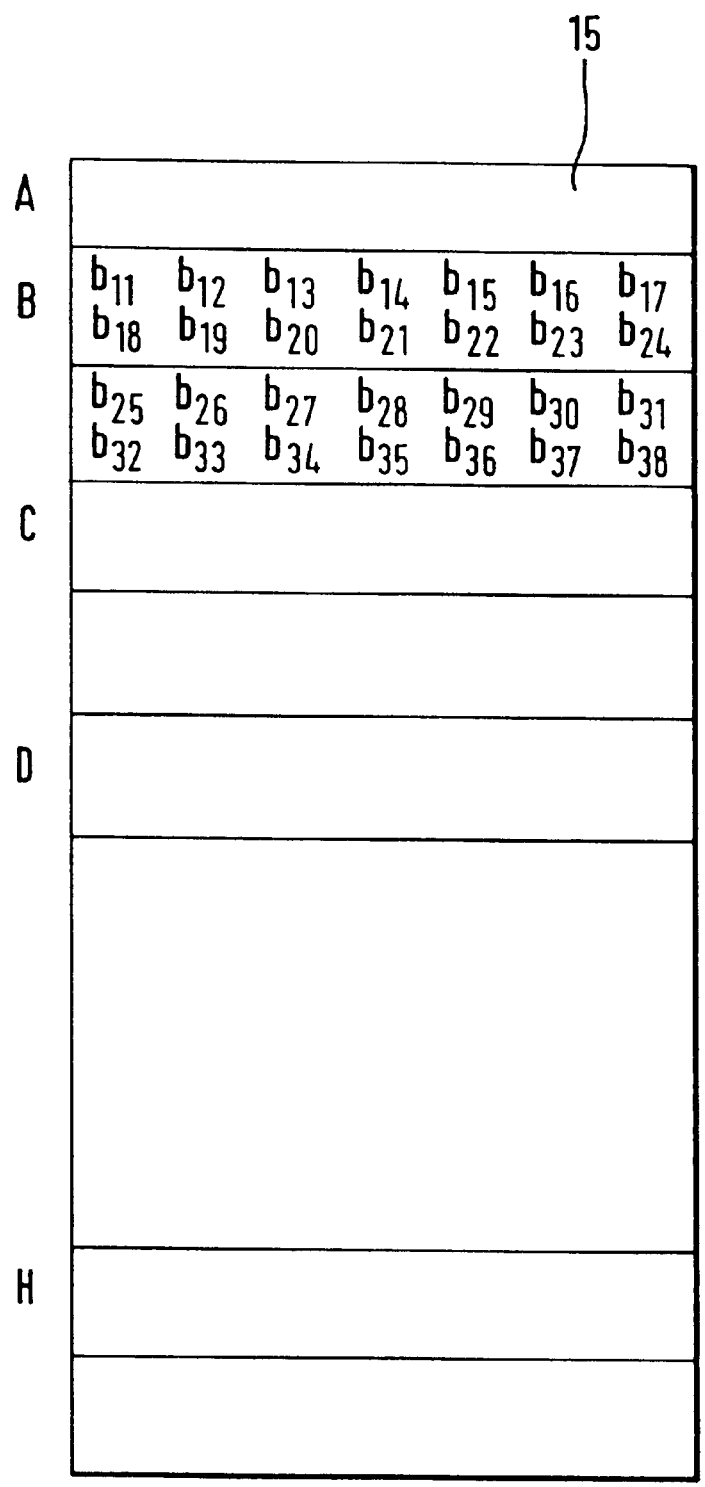
FIG. 4: shows a representation of the memory.

The read-write memory 15, which is implemented as a flash memory, is illustrated in more detail in FIG. 4. The flash memory 15 is bidirectionally connected to the arithmetic unit 13 here. In one example, the flash memory 15 has a memory size of 256 Kb and is organised into 16-byte blocks.

The data access to the memory is defined in the first block A. Block B, which also comprises 16 bytes, is provided for receiving the cyclically changing, operation-dependant data of the motor vehicle. The blocks C to H which adjoin this block contain programs for calculating the driving corridor of the vehicle 1 which is to be controlled, programs for determining the object corridor of the vehicle travelling in front and programs for setting the distance from the selected object on the device for controlling the distance between vehicles of the vehicle which is to be controlled.

Block B is divided into two sectors, the first sector having the memory locations B11 to B24, while the second sector has the memory locations B25 to B38. During one time cycle, the microcomputer 9 reads the necessary control programs out of the program blocks C to G and stores the used and calculated data, necessary for the control operation, at the memory locations B11–B13 of the first sector of block B. The data which are received and calculated in the next time cycle are stored in the memory locations B25–B27 of the second sector of block B. The operational data of the device for controlling the distance between vehicles of the following processing cycle are stored again in the first sector of block B in the memory location B14–B16, while the data of the processing cycle following this of the device 9 for controlling the distance between vehicles are stored in the memory location B28–B30 of block B of the memory 15.

In a further refinement, the memory locations B11 to B24 of the first sector of the memory 15 have data successively written to them in each processing cycle. The memory locations B25 to B29 do not have data written to them in the following cycles until all the memory locations B11 to B24 of the first sector are occupied. If this storage process takes place without errors, the memory locations B11 to B24 of the first sector are cleared. In the adjoining processing cycles, the data are stored at the memory locations B30 to B38 of the second sector of the block B. If all the memory locations B25 to B38 of the second sector of the block B are occupied, the updated operational data of the device for controlling the distance between vehicles are stored at the memory locations B11 to B15 of the first sector before the memory locations B25 to B38 of the second sector are cleared in order to receive new data.

Owing to this method of operation, the data are reliably stored and, when an error occurs, it is always possible to fall back on a data record which is already present. On the other hand, the older data can be cleared, since more up-to-date data are available in the event of errors. Owing to the procedure according to the invention, it is possible to guarantee the access cycles to the memory locations during one operation over the service life (approximately 100,000× terminal 15 On/Off) of a motor vehicle although the number of permissible reading and clearing cycles of an individual memory cell within the memory unit is substantially lower than the read and clearing cycles which are actually necessary during the service life of a motor vehicle.

If, for example, a single memory cell within the memory unit has a permissible number of x reading and clearing cycles, the overall number of possible reading and clearing cycles increases, given a division into n memory sectors, to the number of x • n reading and clearing cycles of the corresponding data.

The invention is not restricted only to the described case of the device for controlling the distance between vehicles in a motor vehicle, but instead can be used for all open-loop and closed-loop control devices of an internal combustion engine.

Thus, it is also conceivable for the memory to be used to store production data during the process of fabricating the control unit, which data are read in directly into the memory module by a test computer.

We claim:

1. An apparatus for storing data of a device which is to be monitored, in particular of a motor vehicle, in which apparatus the data are advantageously stored in a memory unit by means of a control unit, wherein fixed data and continuously updated data of the device (1) which is to be monitored are stored in the same memory unit (15) which contains open-loop and/or closed-loop control processes.

2. The apparatus as claimed in claim 1, wherein the data are stored in a region (B) of the memory unit (15) which is permanently defined by addresses of individual memory locations (B11–B38).

3. The apparatus as claimed in claim 2, wherein the region (B) of the memory unit (15) is divided into first and second sectors (B11–B24; B25–B38).

4. An apparatus for storing data of a device which is to be monitored, in particular of a motor vehicle, in which apparatus the data are advantageously stored in a memory unit by means of a control unit, wherein fixed data and continuously updated data of the device (1) which is to be monitored are stored in the same memory unit (15) which contains open-loop and/or closed-loop control processes;

wherein the data are stored in a region (B) of the memory unit (15) which is permanently defined by addresses of individual memory locations (B11–B38), and the region (B) of the memory unit (15) is divided into first and second sectors (B11–B24; B25–B38); and the first sector (B11–B24) of the defined region (B) is completely filled with the data, and the first sector (B11–B24) is not completely cleared until after data have been written to individual memory locations of the second sector (B25–B38).

5. The apparatus as claimed in claim 3, wherein operational data are alternately written to the two Sectors (B11–B24; B25–B38) of the defined region (B) of the memory unit (15).

6. The apparatus as claimed in claim 1, wherein the memory unit (15) is an electrically clearable memory circuit.

7. The apparatus as claimed in claim 1, wherein the control unit is a device (3) in the motor vehicle (1) for controlling a distance between vehicles, which device stores, in a predefined time set pattern, object data and data relating to vehicle dynamics as operational data in the memory unit (15).

* * * * *